(12) United States Patent
Kallioinen et al.

(10) Patent No.: US 11,177,411 B2
(45) Date of Patent: Nov. 16, 2021

(54) PHOTOSENSITIVE FIELD-EFFECT TRANSISTOR

(71) Applicant: EMBERION OY, Espoo (FI)

(72) Inventors: Sami Kallioinen, Espoo (FI); Martti Voutilainen, Espoo (FI)

(73) Assignee: EMBERION OY, Espoo (FI)

( * ) Notice: Subject to any disclaimer, the term of this patent is extended or adjusted under 35 U.S.C. 154(b) by 0 days.

(21) Appl. No.: 16/758,736

(22) PCT Filed: Oct. 23, 2018

(86) PCT No.: PCT/EP2018/079010
§ 371 (c)(1),
(2) Date: Apr. 23, 2020

(87) PCT Pub. No.: WO2019/081492
PCT Pub. Date: May 2, 2019

(65) Prior Publication Data
US 2020/0373454 A1 Nov. 26, 2020

(30) Foreign Application Priority Data
Oct. 26, 2017 (FI) .................................. 20175948

(51) Int. Cl.
*H01L 31/113* (2006.01)
*H01L 29/06* (2006.01)
(Continued)

(52) U.S. Cl.
CPC ...... *H01L 31/1136* (2013.01); *H01L 29/0669* (2013.01); *H01L 29/1606* (2013.01); *H01L 31/035218* (2013.01); *H01L 51/428* (2013.01)

(58) Field of Classification Search
CPC ......... H01L 31/1136; H01L 31/035218; H01L 31/113; H01L 29/0669; H01L 29/1606; H01L 51/428; Y02E 10/549
See application file for complete search history.

(56) References Cited

U.S. PATENT DOCUMENTS

| | | | |
|---|---|---|---|
| 2013/0032782 A1* | 2/2013 | Gerasimos | H01L 31/028 257/21 |
| 2014/0001542 A1* | 1/2014 | Franklin | B82Y 10/00 257/330 |

(Continued)

FOREIGN PATENT DOCUMENTS

| | | |
|---|---|---|
| CN | 103633183 A | 3/2014 |
| EP | 3104416 A1 | 12/2016 |

(Continued)

OTHER PUBLICATIONS

O'Neil "The Merck Index", Merck and Co, Inc 2001 p. 837. Retrieved from Internet: <https://pubchem.ncbi.nlm.nih.gov/compound/Hexamethyldisilazane#section=Other-Experimental-Properties> (Year: 2001).*

(Continued)

*Primary Examiner* — Sitaramarao S Yechuri
(74) *Attorney, Agent, or Firm* — Squire Patton Boggs (US) LLP

(57) ABSTRACT

A photosensitive field-effect transistor comprising a substrate with a source electrode, a drain electrode and a gate electrode. The transistor comprises a photoactive layer which at least partly covers the gate electrode, and a channel layer which covers the photoactive layer and at least partly covers both the source electrode and the drain electrode. The channel layer comprises a two-dimensional material whose conductivity is modulated by charge carriers transferred from the photoactive layer when electromagnetic radiation is absorbed in the photoactive layer.

10 Claims, 5 Drawing Sheets

(51) Int. Cl.
*H01L 29/16* (2006.01)
*H01L 31/0352* (2006.01)
*H01L 51/42* (2006.01)

(56) References Cited

U.S. PATENT DOCUMENTS

| | | | |
|---|---|---|---|
| 2014/0263945 A1 | 9/2014 | Huang et al. | |
| 2014/0306184 A1* | 10/2014 | Ruhl | H01L 29/7788 257/29 |
| 2016/0343891 A1 | 11/2016 | Heo et al. | |
| 2017/0256667 A1 | 9/2017 | Lee et al. | |

FOREIGN PATENT DOCUMENTS

| | | |
|---|---|---|
| EP | 3109907 A1 | 12/2016 |
| EP | 3 136 445 A1 | 3/2017 |
| EP | 3 231 768 A1 | 10/2017 |

OTHER PUBLICATIONS

International Search Report and Written Opinion dated Jan. 22, 2019 corresponding to International Patent Application No. PCT/EP2018/079010.
Wenjing Jie et al., "Graphene-based hybrid structures combined with functional materials of ferroelectrics and semiconductors," Nanoscale, vol. 6, No. 12, Feb. 25, 2014, pp. 6346-6362, XP055541626.
Alexander A. Bessonov et al., "Compound Quantum Dot-Perovskite Optical Absorbers on Graphene Enhancing Short-Wave Infrared Photodetection," ACS Nano, vol. 11, No. 6, May 30, 2017, pp. 5547-5557, XP055541431.
Zhenhua Sun et al., Plasmonic-enhanced perovskite-graphene hybrid photodetectors. In: Nanoscale. The Royal Society of Chemistry [online], Feb. 5, 2016, vol. 8, No. 14.
J. Kim et al., Quasi-Two-Dimensional h-BN/B-Ga2O3 Heterostructure Metal-Insulator-Semiconductor Field-Effect Transistor. In: ACS applied materials & interfaces. American Chemical Society, May 31, 2017, vol. 9, No. 25.

* cited by examiner

PHOTOSENSITIVE FIELD-EFFECT TRANSISTOR

FIELD OF THE DISCLOSURE

This disclosure relates to field-effect transistors prepared on the surface of a substrate, and more particularly to field-effect transistors which can be used for detecting the intensity of electromagnetic radiation. The present disclosure further concerns methods for manufacturing such field-effect transistors.

BACKGROUND OF THE DISCLOSURE

Field-effect transistors which utilize two-dimensional materials in the transistor channel can be used as versatile detectors of electromagnetic radiation at wavelengths ranging from infrared to ultraviolet, constituting a class of photosensitive transistors, or phototransistors. A graphene field-effect transistor (GFET), for example, comprises a semiconducting graphene channel whose conductivity increases when it is illuminated by electromagnetic radiation. This increased conductivity can be measured, and strongly amplified, in a field-effect transistor geometry where the current through the channel is controlled by a gate voltage applied to the gate electrode.

It is known that graphene absorbs electromagnetic radiation uniformly in a broad range of wavelengths, but absorption in one graphene layer is limited to about 2.3% at most wavelengths. The absorption in a graphene layer, and the spectral responsivity of a graphene field-effect transistor comprising the graphene layer, can be increased by preparing an additional photoactive layer adjacent to the graphene channel. Such photoactive layers can donate charge carriers to the graphene channel when they are released in the photoactive layer by electromagnetic radiation. Photoactive layers can also expand the spectral response of GFETs to a broader wavelength range.

Quantum dot materials, or semiconductor nanocrystals, can be used in photoactive layers. When electromagnetic radiation is absorbed in the quantum dots, the photogenerated charges can be separated so that one charge-carrier type is trapped in the quantum dots and another carrier type transferred to the graphene channel. The absorption of electromagnetic radiation thereby modulates the conductivity of the graphene channel by inducing an increase in free charges in the channel.

Photoactive layers may be approximately 10-500 nm thick, and with suitably chosen materials they can absorb a sufficient amount of electromagnetic radiation at the desired wavelengths. Electrically passive photoactive layers may be made electrically active by adding another contact electrode to a GFET, which also may facilitate the use of thicker photoactive layers.

Document CN103633183 discloses a photosensitive graphene field-effect transistor comprising a graphene channel, where source and drain electrodes and a photoactive quantum dot layer have been deposited on top of the graphene channel.

A problem with device structures where the two-dimensional channel material lies below the photoactive layer, and/or below other device components, is that the two-dimensional material must withstand the subsequent manufacturing steps without being contaminated or damaged. The sensitivity of the two-dimensional material to damage and impurities therefore limits the material and process choices that can be used in subsequent manufacturing stages.

Another problem with device structures where the two-dimensional channel material lies below the photoactive layer is that the intensity of electromagnetic radiation weakens as it moves through the photoactive layer, and the two-dimensional material is located on the bottom side where the intensity will be weakest, which can limit the quantum efficiency of the phototransistor.

BRIEF DESCRIPTION OF THE DISCLOSURE

An object of the present disclosure is to provide a method and an apparatus to alleviate the above disadvantages.

The objects of the disclosure are achieved by a method and an arrangement which are characterized by what is stated in the independent claims. The preferred embodiments of the disclosure are disclosed in the dependent claims.

The disclosure is based on the idea of depositing the photoactive layer on a gate electrode on the surface of a substrate before the layer of two-dimensional material is deposited on the photoactive layer. An advantage of the method and arrangement of this disclosure is that the two-dimensional material can be processed after process steps which may damage this material. This reduces the risk of damage in the layer of two-dimensional material, and it also facilitates the use of a wider range of materials and processes when the photoactive layer is deposited, since compatibility with an underlying two-dimensional material is not an issue. Another advantage of the method and arrangement of this disclosure is that the layer of two-dimensional material is located on the top side of the photoactive layer, where light intensity and light absorption is strongest.

BRIEF DESCRIPTION OF THE DRAWINGS

In the following the disclosure will be described in greater detail by means of preferred embodiments with reference to the accompanying drawings, in which.

DETAILED DESCRIPTION OF THE DISCLOSURE

Throughout this disclosure, graphene will be the primary example of a two-dimensional material, and graphene field-effect transistors will be the primary focus in the following discussion. However, examples will also be given of other semiconducting two-dimensional materials, which exhibit similar behaviour and can be utilized as channel materials in photosensitive transistors.

A quantum dot layer comprising semiconductor nanocrystals will be the primary example of a photoactive layer, but there are also other materials capable of absorbing photons and modulating the conductivity of the transistor channel. Alternative photoactive layers will be presented in the discussion below.

Figure 1:
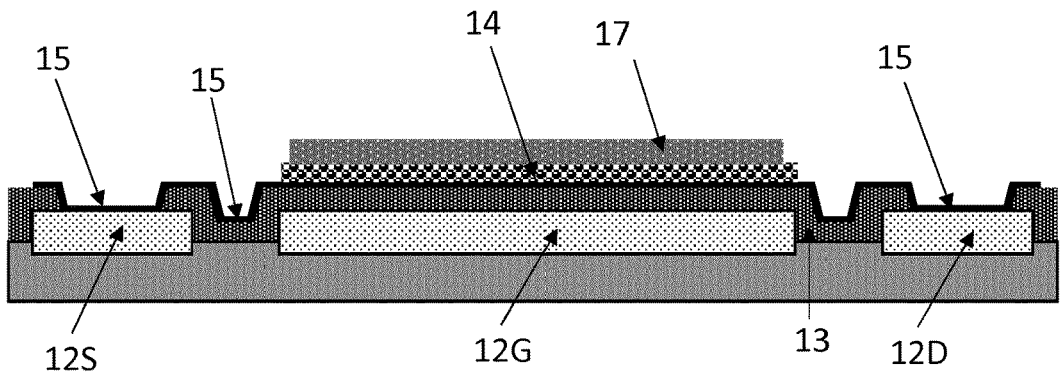
FIG. 1 illustrates a photosensitive field-effect transistor according to the prior art.

FIG. 1 illustrates a prior art photosensitive field-effect transistor where a source electrode 12S and a drain electrode 12D have been prepared on a substrate. A patterned insulating layer 13 covers the edges of these electrodes and the intervening space on the substrate surface. The transistor channel layer 15 is a thin layer of two-dimensional material. The conductivity of the transistor channel 15 may be adjusted either with a top contact 17, which is separated from the channel 15 only by photoactive material 14, or with a bottom gate electrode 12G, which is separated from the channel 15 by insulating layer 13. Alternatively, both a top contact and a bottom gate electrode may be used. The photoactive material 14 is deposited on the transistor channel 15.

This disclosure presents a photosensitive field-effect transistor comprising a substrate with at least one electrically conducting source electrode, at least one electrically conducting drain electrode and at least one electrically conducting gate electrode on the substrate. The transistor also comprises a photoactive layer which at least partly covers the gate electrode, and a channel layer which covers the photoactive layer and at least partly covers both the source electrode and the drain electrode. The channel layer comprises a two-dimensional material whose conductivity is modulated by charge carriers transferred from the photoactive layer when electromagnetic radiation is absorbed in the photoactive layer. One or more dielectric layers cover or overlie the channel layer.

In this disclosure, the verb "cover" refers to vertical alignment with direct contact. The word "vertical" refers to the direction perpendicular to the substrate plane, whereas the word "lateral" can be used to refer to a direction or an area parallel to the substrate plane. When a first layer "covers" a second layer, the first layer and the second layer are vertically aligned, and they are in direct contact with each other. In other words, the two layers have been sequentially deposited on a given area of the substrate. They are vertically aligned because the second layer has been deposited on this area first, and then the first layer has been deposited on the same area. Within this area, the second layer therefore lies below the first layer in the vertical direction. The first layer "covers" the second layer in this area because no other layers lie between the first and the second layer.

In this disclosure, the verb "overlie" refers to vertical alignment without direct contact. When a first layer "overlies" a second layer, the first layer and the second layer are vertically aligned, but they are not in direct contact with each other. In other words, the two layers have both been deposited on a given area of the substrate, but a third intervening layer has been deposited between them. These three layers are all vertically aligned. The second layer has been deposited on this area first, then the third layer has been deposited on the same area, and then the first layer has been deposited on the same area. Within this area, the second layer therefore lies below the third and the first layer. The third layer lies above the first layer but below the second layer in the vertical direction. The first layer "overlies" the second layer in this area, but does not "cover" it, because the third layer lies between the first and the second layer.

The verbs "cover" and "overlie", when used with no further qualifiers, refer to complete vertical alignment where no area of the second layer is uncovered, or not overlain, by the first layer. Closed qualified expressions such as "partly cover" and "partly overlie" are used to refer to partial vertical alignment, where there is an area of the second layer which is not covered, or not overlain, by the first layer. Open qualified expressions such as "at least partly cover" and "at least partly overlie" are used to refer to vertical alignment which can be either complete or partial.

In this disclosure, expressions stating that an object is present (or is deposited) "on the substrate" can mean either that the object covers (or is deposited so that it covers) the substrate in part or in whole, or that the object overlies (or is deposited so that it overlies) the substrate in part or in whole. In other words, an electrode "on the substrate" can either be an electrode in direct contact with the substrate, or an electrode which is in direct contact with one or more intervening layers which cover the substrate. In other words, an electrode "on the substrate" may either cover or overlie a part of the substrate. In the case of a deposition method, it may be specified that several layers are sequentially deposited "on the substrate". The order in which such deposition steps are specified corresponds to the order in which the layers are deposited on the substrate, or on certain regions of the substrate. The order consequently determines which (preceding) layers a given layer covers or overlies in a certain region of the substrate, and which (subsequent) layers will in turn cover or overlie the given layer in a certain region of the substrate.

This disclosure also presents a method for making a photosensitive field-effect transistor. The method comprises the steps of (1) depositing at least one electrically conducting source electrode, at least one electrically conducting drain electrode and at least one electrically conducting first gate electrode on the surface of a substrate, (2) depositing a photoactive layer on the substrate so that it covers at least a part of the first gate electrode, (3) depositing a channel layer on the substrate so that it covers the photoactive layer and at least partly covers both the source electrode and the drain electrode, wherein the channel layer comprises a two-dimensional material whose conductivity is modulated by charge carriers transferred from the photoactive layer when electromagnetic radiation is absorbed in the photoactive layer, and (4) depositing one or more dielectric layers on the substrate so that they cover or overlie the channel layer. A patterned dielectric layer may optionally be deposited on the substrate between steps (1) and (2).

First Embodiment

Figure 2:
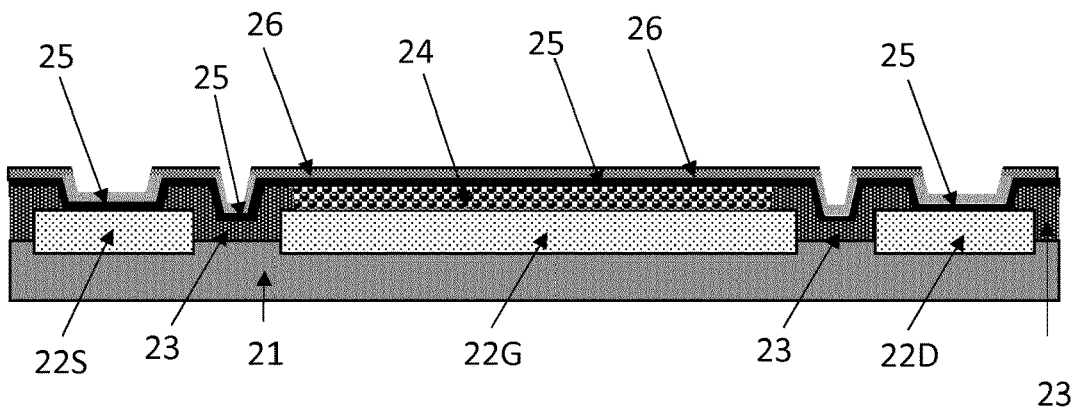
FIG. 2 illustrates a photosensitive field-effect transistor according to a first embodiment.

FIG. 2 illustrates a photosensitive field-effect transistor according to a first embodiment. The figure has not been drawn to scale. The transistor comprises a substrate 21. A source electrode 22S, a drain electrode 22D and a gate electrode 22G have been prepared on the substrate. The gate electrode 22G may also be called a bottom contact. A patterned insulating layer 23 may optionally cover the edges of electrodes 22S, 22D and 22G. The edge layer 23 may thereby serve as a form of container for the layer of photoactive material 24 which covers at least a part of gate electrode 22G. The patterned insulating layer 23 may preferably be 60-80 nm thick, and the thickness of the layer of photoactive material may preferably be in the same range. Alternatively, the insulating layer 23 may be 40-100 nm thick, and the layer of photoactive material 24 may be 40-100 nm thick. Thinner or thicker photoactive layers may also be used, depending on the desired absorption properties of the photoactive material.

Optionally, the layer of photoactive material 24 can be electrically isolated from the gate electrode 22G by a thin dielectric layer.

The channel layer 25 is a thin layer of two-dimensional material which covers the layer of photoactive material 24 entirely and extends sideways at least to the source electrode 22S and the drain electrode 22D. The channel layer covers at least a part of electrode 22S and at least a part of drain electrode 22D. A dielectric layer 26 covers the channel layer 25. Different dielectric layers are used in different regions of the substrate, in which case they may cover the channel layer 25 together.

Electromagnetic radiation which is absorbed in the photoactive material can modulate the conductivity of the two-dimensional material in channel layer 25 in the manner described above. With a suitably chosen drain-source voltage and gate voltage, the drain-source current can be used as an indicator of irradiation intensity and photosensitive field-effect transistor can thereby be used as a photodetector. Suitably selected photoactive materials can sensitize the photosensitive field-effect transistor to wavelengths ranging from infrared to ultraviolet (and even to x-ray wavelengths if the transistor is coupled to a scintillator).

The photoactive layer 24 may comprise an n-type semiconducting material or a p-type semiconducting material. The following materials can be used in the photoactive layer in any embodiment presented in this disclosure.

The photoactive layer 24 may, for example, comprise semiconductor nanocrystals or colloidal quantum dots including PbS, PbSe, PbTe, CdS, CdSe, CdTe, ZnS, ZnO, CuS, $Cu_2S$, $Cu_2Se$, CZTS, MnS, $Bi_2S_3$, $Ag_2S$, $Ag_2Se$, HgTe, HgCdTe, GaSe, $MoS_2$, CIS, InAs, InSb, Ge, Si, graphene, or core/shell nanocrystals with any of the preceding core/shell constituents.

Alternatively, the photoactive layer 24 may comprise a thin-film layer of PbS, PbSe, PbTe, CdS, CdSe, CdTe, ZnS, ZnO, CuS, $Cu_2S$, $Cu_2Se$, CZTS, MnS, $Bi_2S_3$, $Ag_2S$, $Ag_2Se$, HgTe, HgCdTe, GaSe, $MoS_2$, CIS, InAs, InSb, Ge, Si or graphene.

Alternatively, the photoactive layer 24 may comprise semiconductor nanocrystals or colloidal quantum dots embedded in a host material comprising metal chalcogenide, metal halide, or hybrid halide perovskite of the general formula $ABX_3$, where A is Cs, $CH_3NH_3$ or $NH_2CH=NH_2$, B is Pb or Sn, and X is Cl, Br or I.

The metal chalcogenide may alternatively have the general formula $ME_n$, where E is S, Se or Te, and it may for example be $AsE_n$, $CdE_n$, $CuE_n$, $ZnE_n$, $SnE_n$, $SbE_n$, $InE_n$, $MoE_n$, or $BiE_n$. The metal halide may have the general formula $MX_n$, where M is Pb, Bi, Cd, In, Zn, Sn, Cu, Fe, Ga, Li or Sb and X is I, Br or Cl, and it may for example be $PbI_2$ or $BiI_3$.

The quantum dot loading in the host material may vary between 1% and 90%. The diameter of the semiconductor nanocrystals or quantum dots may, for example, be in the range 2-20 nm. The photosensitive semiconductor materials may provide substantial optical absorption in the wavelength range of 0.2-5 µm, defined by the optical bandgap of materials used.

The capping ligands on the above semiconductor materials may comprise organic molecules or inorganic molecules, or a combination of both. Organic ligands may include, but are not limited to, alkyl or aryl thiols, such as 1,2-ethanedithiol, 3-mercaptopropionic acid, benzenethiol, etc. Organic ligands may also include alkyl or aryl amines, N-heterocycles, such as 1,2-ethylenediamine, pyridine, etc. Inorganic ligands may include atomic halogens (I, Br, Cl), pseudo halogens (SCN), or chalcogens (S, Se). Inorganic ligands may also include metal halides or metal chalcogenides.

The photoactive layer may alternatively be a thin-film semiconducting layer with a crystalline or amorphous structure. The thin-film semiconducting layer may comprise a material selected from the group: PbS, PbSe, PbTe, CdS, CdSe, CdTe, ZnS, ZnO, CuS, $Cu_2S$, $Cu_2Se$, CZTS, MnS, $Bi_2S_3$, $Ag_2S$, $Ag_2Se$, HgTe, HgCdTe, HgS, HgSe, GaSe, GaAs, $MoS_2$, $WS_2$, CIS, InAs, InSb, InP, Ge, or Si.

If multiple photosensitive field-effect transistors are present on the same substrate as separate pixels, some of these pixels may comprise a first photoactive material while others comprise different photoactive materials. The pixels may thereby be sensitized to different wavelengths of electromagnetic radiation.

The following materials can be used in the channel layer in any embodiment presented in this disclosure. The two-dimensional channel may comprise one or more of graphene, a graphene-like material, a transition metal dichalcogenide, or another two-dimensional material.

In this disclosure, graphene is used as an example of a two-dimensional layered material which forms the channel layer. However, other two-dimensional layered materials, such as phosphorene (black phosphorous), silicene, germanene, stanene, GaN, InN, InP, InAs, BAs, BP, or GaP, may also be used in any embodiment presented in this disclosure. Furthermore, the two-dimensional layered material used in any embodiment presented in this disclosure may also be a transition metal dichalcogenide or transition metal oxide, which includes $WE_2$, $MoE_2$, $ScE_2$, $TiE_2$, $HfE_2$, $ZrE_2$, $VE_2$, $CrE_2$, $MnE_2$, $FeE_2$, $CoE_2$, $NiE_2$, $NbE_2$, $TcE_2$, $ReE_2$, $PdE_2$, or $PtE_2$, where E is O, S, Se or Te. The two-dimensional layered material may comprise 1-10 atomic layers, with the total thickness ranging from 0.3 nm to 10 nm.

The two-dimensional material 25 which forms the channel layer may alternatively be an assembly of silicon nanowires, or indium gallium zinc oxide (IGZO), molybdenum disulphide, or molybdenum sulphide. Graphene is used as the primary example of a two-dimensional material in this disclosure, but any semiconductive two-dimensional material whose conductivity can be modulated may be used. The substrate 21 may be a silicon substrate.

Figure 3A:
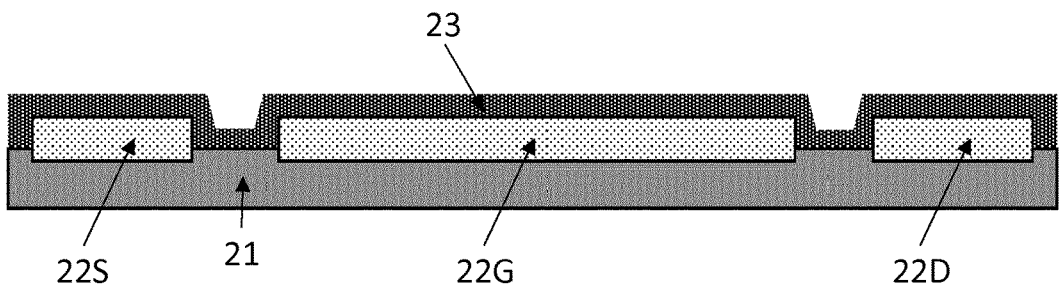
FIGS. 3a-3e illustrate a first method for manufacturing a photosensitive field-effect transistor.

FIGS. 3a-3e illustrate a method for manufacturing the photosensitive field-effect transistor illustrated in FIG. 2. In FIG. 3 the source, gate and drain electrodes 22S, 22G and 22D have been deposited on the substrate 21. These electrodes may, for example, be metallic electrodes deposited in a CVD process or any similar process suitable for this purpose. The gate electrode 22G may preferably cover a relatively large area of the substrate 21 between the source electrode 22S and the drain electrode 22D, as illustrated in FIG. 3a. This increases the optically active area of the photosensitive field-effect transistor. However, the size of the gate electrode 22G may also be smaller in relation to the distance between the source electrode 22S and drain electrode 22D than illustrated in FIG. 3a if other design considerations are more important. More importantly, the top surface of the gate electrode 22G should be very smooth and flat, so that the thin layers subsequently deposited upon also can obtain a smooth and flat shape.

An insulating layer 23 may optionally be deposited on the substrate 21 and on the electrodes 22S, 22G and 22D. It is not absolutely necessary because the subsequently deposited graphene channel can traverse the distance from the gate electrode to the source electrode even on the surface of the substrate 21. However, the insulating layer 23 can in some applications be beneficial because it may provide smoother vertical transitions than the vertical edges of the gate electrode 22G. The surface of the insulating layer 23 may also be smoother than the surface of the substrate 21. The insulating layer 23 may, for example, be a layer of $Al_2O_3$.

Figure 3B:
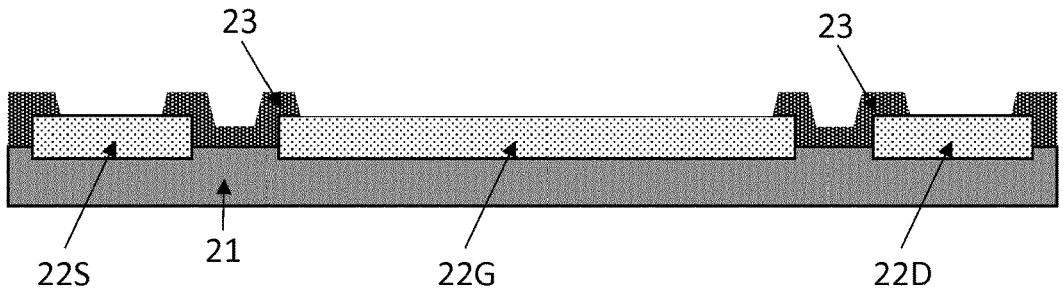
Figure 3C:
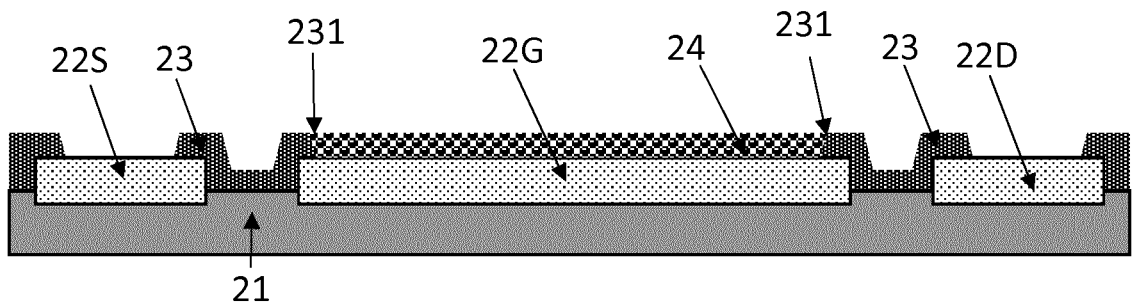

The deposition method may be atomic layer deposition (ALD). Openings can be etched in the insulating layer 23 above the central parts of electrodes 22S, 22G and 22D. FIG. 3b illustrates a process where all three of these openings are etched simultaneously. Alternatively, a gate electrode opening can be etched in the insulating layer 23 before the photoactive layer is deposited on the gate electrode, and a source electrode opening and drain electrode opening can be etched in the insulating layer after the photoactive layer has been deposited on the gate electrode.

A photoactive layer 24 can then be deposited on the substrate so that it covers at least a part of the gate electrode 22G. It may cover all of the gate electrode 22G. If an insulating layer 23 covers the edges of the gate electrode 22G, as in FIG. 3c, then the photoactive layer 24 may cover the remaining part. The photoactive layer may be deposited on the gate electrode by stamping, spin coating, dip coating, spraying, any other printing methods, or chemical vapor deposition. A resist layer (not illustrated) may be used as a mask, so that the photoactive layer 24 is deposited only on the desired area. The resist may then be lifted off the substrate. Alternatively, the photoactive layer 24 can be patterned by means of chemical etching methods. With some deposition methods, it may be advantageous to prepare the photoactive layer 24 to the same height as the insulating layer 23, so that the top surface of the photoactive layer 24 coincides with the edge 231 of the insulating layer 23. The photoactive layer 24 may alternatively be thinner or thicker than the insulating layer 23.

Figure 3D:
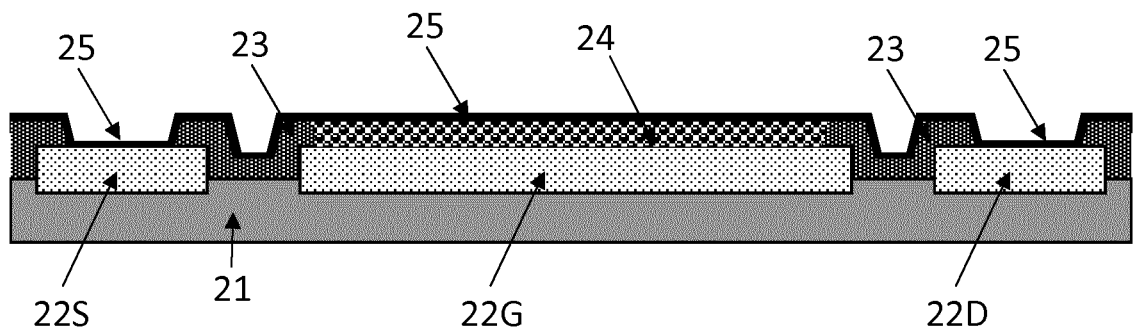

The two-dimensional layer of graphene 25 is then deposited on the substrate surface so that it covers at least the photoactive material 24, at least a part of source electrode 22S and at least a part of drain electrode 22D. The graphene layer also overlies the gate electrode 22G, as illustrated in FIG. 3d. To serve as the channel of the photosensitive field-effect transistor, graphene layer 25 should form a unitary film across the transistor. The graphene film can be deposited on the substrate in a wet or dry transfer method, or in a CVD (chemical vapour deposition) or ALD (atomic layer deposition) growth method.

The deposition process for photoactive layer 24 has been completed before the graphene layer 25 is deposited. This means that the processes and materials used for depositing the photoactive layer do not necessarily have to be compatible with an underlying graphene layer, which is the case in photosensitive transistors where the photoactive layer covers the graphene layer.

All layers above the photoactive layer 24 should be at least partly transparent, but the photoactive layer itself is a light absorber. When electromagnetic radiation enters the photoactive layer 24 from its top side, the intensity of the radiation will diminish exponentially as a function of its penetration depth, in accordance with Lambert-Baer's law. The steepness of this exponential dependence is determined by the absorption coefficient of the photoactive material. The absorption of light will therefore also be strongest close to the top side of the photoactive layer 24. Since the two-dimensional layer of graphene 25 covers the top side of the photoactive material 24, more photons will be available to induce free charge carriers in the graphene channel 25 than when the graphene layer lies below the photoactive layer.

Figure 3E:
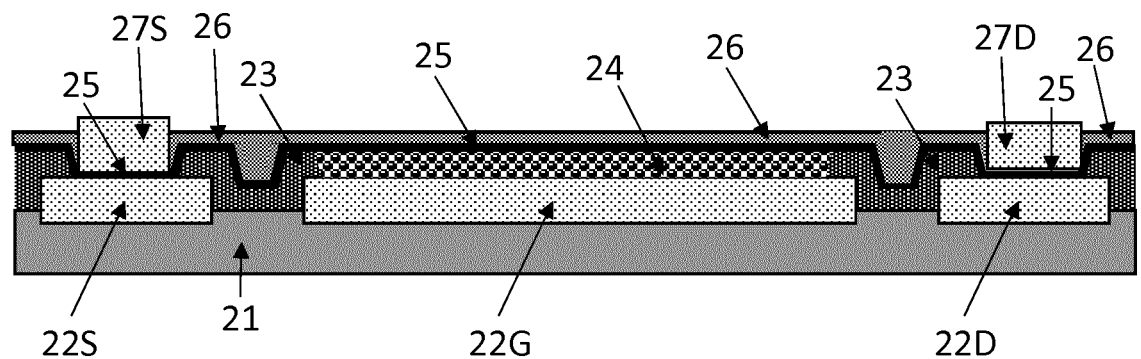

In FIG. 3e, the photosensitive transistor has been covered with a dielectric layer 26 to protect the underlying films. The dielectric layer 26 may, for example, be a $Si_3N_4$ or $Al_2O_3$, $HfO_2$ or any other suitable dielectric layer. It may be deposited in an atomic layer deposition (ALD) process. Electrical contact can be made to the graphene layer either from a top contact which partly covers the graphene layer, or from a bottom contact which is at least partly covered by the graphene layer, or from a pair of top-bottom contacts which sandwich the graphene layer. FIG. 3e illustrates an optional top source contact 27S and an optional top drain contact 27D, which sandwich the graphene layer 25 together with source contact 22S and drain contact 22D, respectively. Sandwich contacting can be used in any of the embodiments presented in this disclosure.

Figure 4A:
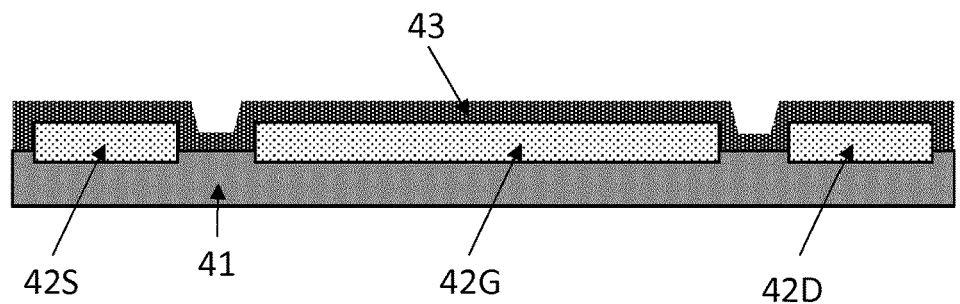
FIGS. 4a-4g illustrate a second method for manufacturing a photosensitive field-effect transistor.
Figure 4B:
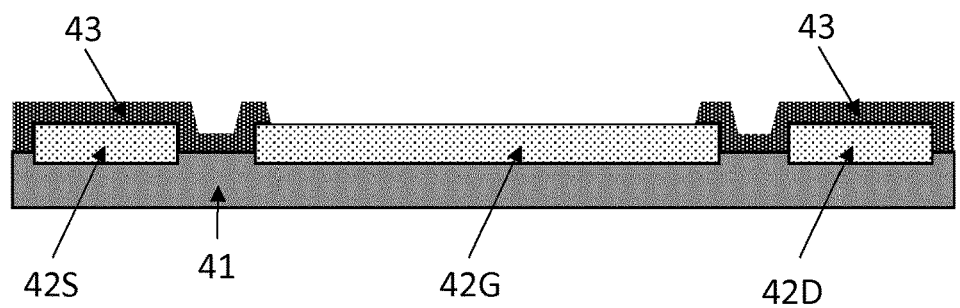
Figure 4C:
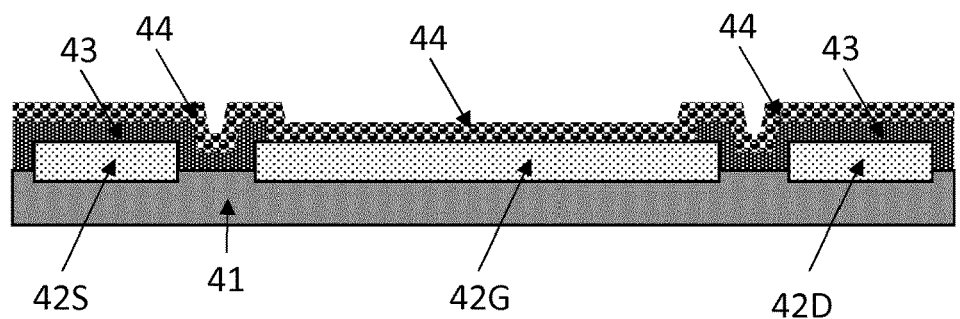

FIGS. 4a-4g illustrate an alternative method for manufacturing a photosensitive field-effect transistor where the photoactive layer is prepared in a dip coating process or the like. Reference numbers 41, 42S, 42G, 42D and 43 correspond to reference numbers 21, 22S, 22G, 22D and 23 in FIG. 3a. In FIG. 4b an opening has been etched in the insulating layer 43 above the gate electrode 42G.

Figure 4D:
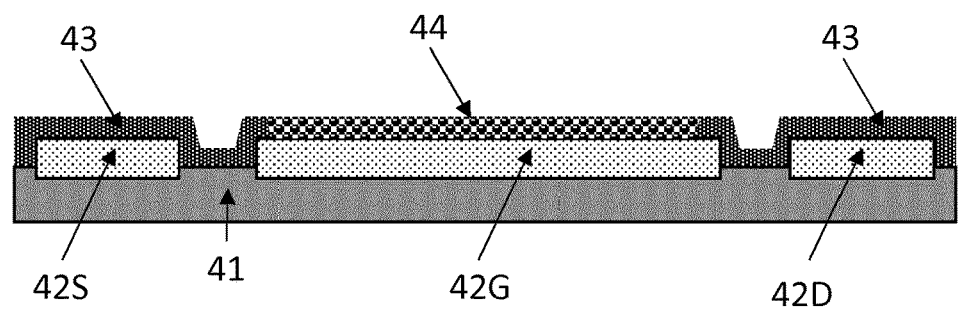
Figure 4E:
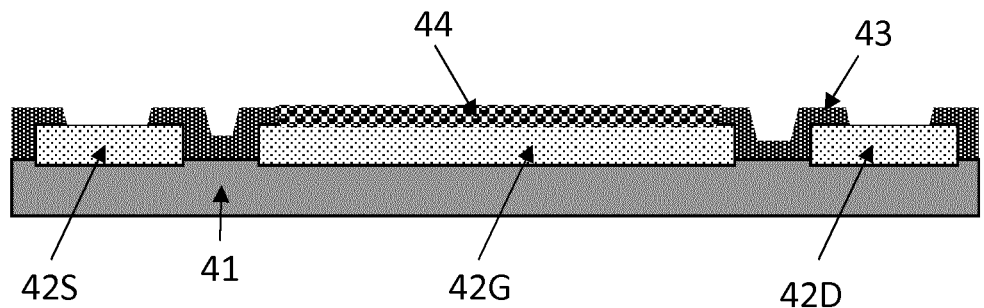
Figure 4F:
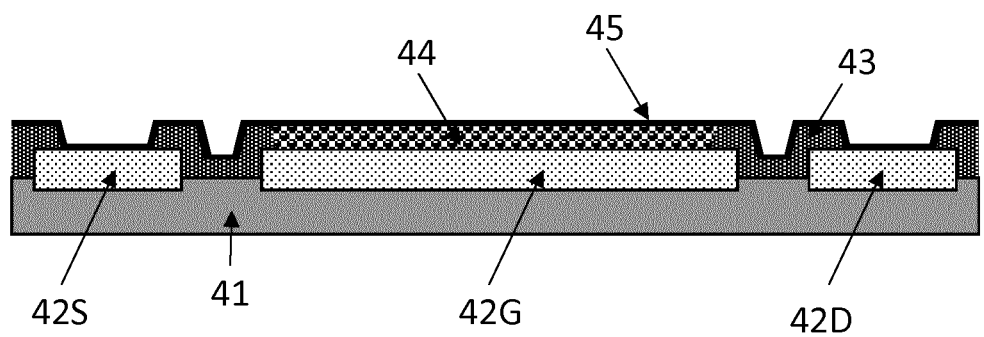
Figure 4G:
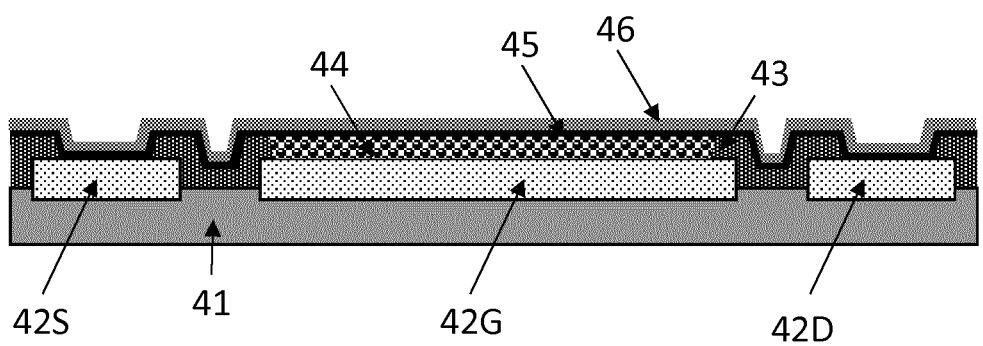

A photoactive layer 44 can then be deposited on the substrate, for example in a dip-coating process, so that it covers the entire substrate area. All other areas except the area above the gate electrode 42G are protected by insulating layer 43. The photoactive layer may then be patterned, as illustrated in FIG. 4d, so that it covers only the area above the gate electrode 42G. Vertical openings to the source electrode 42S and gate electrode 42D may then be etched in insulating layer 43, as illustrated in FIG. 4e. A graphene layer 45 and a dielectric layer 46 may then be deposited over the photosensitive field-effect transistor, as illustrated in FIGS. 4f-4g.

Second Embodiment

Figure 5:
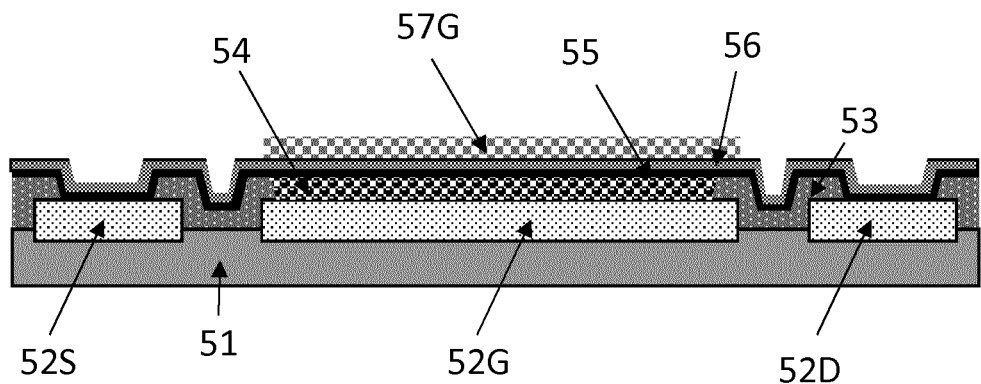
FIG. 5 illustrates a photosensitive field-effect transistor according to a second embodiment.

FIG. 5 illustrates a photosensitive field-effect transistor according to a second embodiment. The transistor comprises the same components which have been illustrated in FIGS. 2, 3e, and 4g. In other words, reference numbers 51, 52S, 52G, 52D, 53, 54, 55, and 56 correspond to reference numbers 21, 22S, 22G, 22D, 23, 24, 25, and 26 in FIGS. 2 and 3e and to reference numbers 41, 42S, 42G, 42D, 43, 44, 45, and 46 in FIG. 4g. These components can be prepared with either of the methods presented above. The electrode 52G may be called the first gate electrode.

The transistor further comprises at least one electrically conducting second gate electrode 57G which partly covers the dielectric layer 56 and at least partly overlies the photoactive layer 54. The second gate electrode 57 may, for example, be a transparent conducting oxide such as indium-tin-oxide, but it can also be layer of gold or aluminium which is sufficiently thin to be almost transparent to the radiation which is measured. Alternatively, the second gate electrode 57 may be a layer of graphene. Other materials with sufficient transparency and conductance may also be used.

An electric field applied in the vertical direction across the photosensitive transistor, from the first gate electrode 52G to the second gate electrode 57G, can accelerate charge separation in the photoactive layer 54 and thereby improve its sensitivity.

Third Embodiment

In addition to the electrode geometry illustrated in FIG. 5, structures where the photoactive layer lies below the two-dimensional channel layer also facilitate other two-sided gating solutions.

Figure 6:
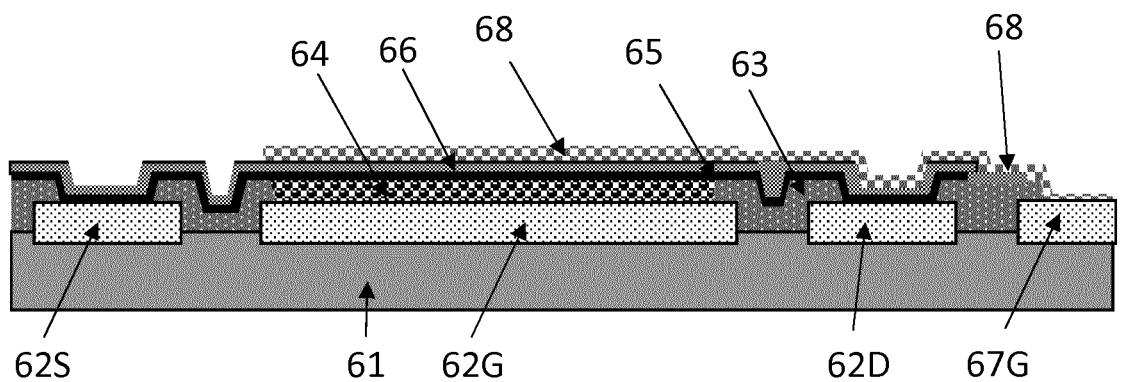
FIG. 6 illustrates a photosensitive field-effect transistor according to a third embodiment.

FIG. 6 illustrates a configuration where a second gate electrode is connected to an electrode on the substrate surface. Reference numbers 61, 62S, 62G, 62D, 63, 64, 65, and 66 again correspond to reference numbers 21, 22S, 22G, 22D, 23, 24, 25, and 26 in FIGS. 2 and 3e. The transistor also comprises at least one electrically conducting second gate electrode 67G on the substrate 61, and an electrically conducting contact layer 68 which partly covers the dielectric layer 66, at least partly covers the second gate electrode 67G, and at least partly overlies the photoactive layer 64.

In other words, the contact layer 68 may overlie the first gate electrode 62G, the photoactive layer 64, and the graphene layer 25, and cover the dielectric layer 66, in the region of the photosensitive field-effect transistor where all of these elements are vertically aligned. The contact layer 68 may also overlie the drain electrode 62D, as illustrated in FIG. 6, or the source electrode. Dielectric layer 66 must separate the contact layer 68 from the graphene layer 65 in all regions where the contact layer 68 overlies the graphene layer. In other words, the contact layer should not cover the graphene layer in any region of the photosensitive field-effect transistor.

As above, an electric field applied from the first gate electrode 62G to the second gate electrode 67G can accelerate charge separation in the photoactive layer 64. Further protective layers may be added on top of the contact layer 68 for protective purposes. The contact layer 68 may, for example, be a transparent conducting oxide such as indium-tin-oxide, or a layer of gold, aluminium or graphene, or any other sufficiently transparent and conducting material.

The invention claimed is:

1. A photosensitive field-effect transistor, comprising:
   a substrate with at least one electrically conducting source electrode on the substrate;
   at least one electrically conducting drain electrode on the substrate;
   at least one electrically conducting gate electrode on the substrate;
   a photoactive layer which at least partly covers the gate electrode, wherein the photoactive layer comprises semiconductor nanocrystals or colloidal quantum dots;
   a channel layer which covers the photoactive layer and at least partly covers both the source electrode and the drain electrode, wherein the channel layer comprises a two-dimensional material whose conductivity is modulated by charge carriers transferred from the photoactive layer when electromagnetic radiation is absorbed in the photoactive layer; and
   one or more dielectric layers which cover or overlie the channel layer.

2. The photosensitive field-effect transistor according to claim 1, wherein the transistor further comprises at least one electrically conducting second gate electrode which partly covers the one or more dielectric layers and at least partly overlies the photoactive layer.

3. The photosensitive field-effect transistor according to claim 1, wherein the transistor further comprises at least one electrically conducting second gate electrode on the substrate, and an electrically conducting contact layer which partly covers the one or more dielectric layers, at least partly covers the second gate electrode, and at least partly overlies the photoactive layer.

4. The photosensitive field-effect transistor according to claim 1, wherein the two-dimensional material comprise graphene, an assembly of silicon nanowires, or indium gallium zinc oxide.

5. The photosensitive field-effect transistor according to claim 1, wherein the photoactive layer comprises semiconductor nanocrystals or colloidal quantum dots embedded in a host material comprising metal chalcogenide, metal halide, or hybrid halide perovskite.

6. A method of making a photosensitive field-effect transistor, said method comprising:
   depositing at least one electrically conducting source electrode, at least one electrically conducting drain electrode and at least one electrically conducting first gate electrode on a substrate;
   depositing a photoactive layer on the substrate so that it covers at least a part of the first gate electrode, wherein the photoactive layer comprises semiconductor nanocrystals or colloidal quantum dots;
   depositing a channel layer on the substrate so that it covers the photoactive layer and at least partly covers both the source electrode and the drain electrode, wherein the channel layer comprises a two-dimensional material whose conductivity is modulated by charge carriers transferred from the photoactive layer when electromagnetic radiation is absorbed in the photoactive layer; and
   depositing one or more dielectric layers on the substrate so that they cover or overlie the channel layer.

7. The method according to claim 6, wherein said method also comprises depositing at least one electrically conducting second gate electrode on the substrate so that it partly covers the one or more dielectric layers and at least partly overlies the photoactive layer.

8. The method according claim 6, wherein said method also comprises the steps of:
   depositing at least one electrically conducting second gate electrode on the substrate; and
   depositing an electrically conducting contact layer on the substrate so that it partly covers the one or more dielectric layers, at least partly covers the second gate electrode, and at least partly overlies the photoactive layer.

9. The method according to claim 6, wherein the two-dimensional material comprises graphene, a bundle of silicon nanowires or indium gallium zinc oxide.

10. The method according to claim 6, wherein the nanocrystals or colloidal quantum dots are embedded in a host material comprising metal chalcogenide, metal halide, or hybrid halide perovskite.

* * * * *